310-322 SR
12/16/80 XR 4,240,002

United States Patent [19] [11] 4,240,002
Tosi et al. [45] Dec. 16, 1980

[54] PIEZOELECTRIC TRANSDUCER ARRANGEMENT WITH INTEGRAL TERMINALS AND HOUSING

[75] Inventors: Kenneth F. Tosi, Plantation; John M. McKee, Coral Springs, both of Fla.

[73] Assignee: Motorola, Inc., Schaumburg, Ill.

[21] Appl. No.: 26,624

[22] Filed: Apr. 2, 1979

[51] Int. Cl.[3] .............................................. H01L 41/08

[52] U.S. Cl. .................................... 310/324; 310/322; 310/334; 179/110 A

[58] Field of Search ............... 310/321, 322, 324, 330, 310/334, 338, 340, 344, 365; 179/110 A; 340/384 E, 388

[56] References Cited

U.S. PATENT DOCUMENTS

| | | | |
|---|---|---|---|
| 2,877,362 | 3/1959 | Tibbetts | 310/344 X |
| 3,167,668 | 1/1965 | Nesh | 310/340 |
| 3,222,462 | 12/1965 | Karmann | 179/110 A |
| 3,396,286 | 8/1968 | Anderson et al. | 310/334 |
| 4,004,409 | 1/1977 | Ganter et al. | 310/324 X |
| 4,006,371 | 2/1977 | Quirk | 310/322 |

*Primary Examiner*—Mark O. Budd
*Attorney, Agent, or Firm*—Margaret Marsh Parker; James W. Gillman

[57] ABSTRACT

A miniature piezoelectric element is conductively mounted on a metal diaphragm having one or two projecting tabs which provide two solderless terminals. An insulating area is screened onto the diaphragm around the piezoelectric element and out onto one tab. A conductive layer is formed on the upper surface of the active element and out onto the insulating area on the tab without contacting the diaphragm. The diaphragm can then be supported within any suitable housing with the tab or tabs projecting for contact by a miniature connector.

4 Claims, 5 Drawing Figures

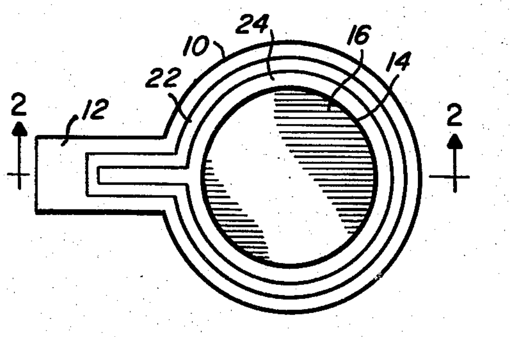
Fig. 1
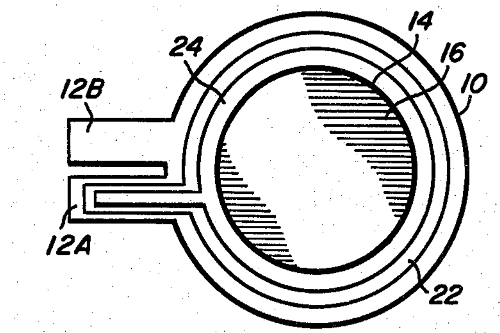
Fig. 3
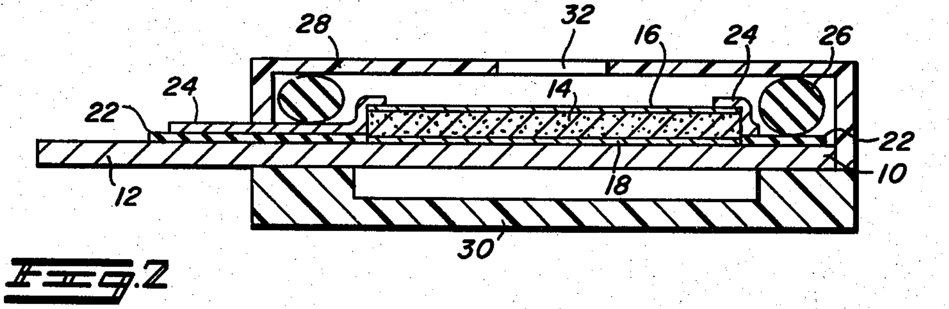
Fig. 2
Fig. 4
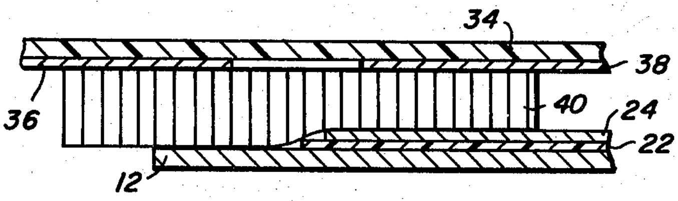
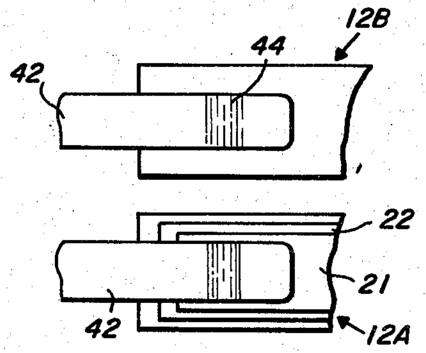
Fig. 5

PIEZOELECTRIC TRANSDUCER ARRANGEMENT WITH INTEGRAL TERMINALS AND HOUSING

BACKGROUND OF THE INVENTION

This invention relates to the field of transducers and particularly to very small transducers utilizing piezoelectric elements and screened-on electrodes for solderless contacts.

Piezoelectric elements used in transducers have utilized electrodes which were formed on the surfaces with contact made to the electrodes by soldered connections. In relatively large transducers, this was completely satisfactory but with increased miniaturization as in such devices as personal pagers, a problem arises with soldering which becomes more troublesome as the active element size becomes smaller. The heat of soldering becomes destructive and the unpredictable mass loading effect of the solder becomes intolerable. Soldering of leads also makes repair or replacement of a unit difficult or impossible.

Another type of transducer assembly is disclosed in a U.S. Pat. No. 3,548,116 assigned to the present assignee and shows one or two piezoelectrically active elements attached to a solid metal plate or vane which then forms one contact terminal. Another U.S. patent, U.S. Pat. No. 4,078,160, assigned to the same assignee, replaces the metal vane with a conductive mesh to reduce the mechanical losses inherent in the earlier solid metal vane. The second contact was made via foil rings conductively cemented to the outer faces of the elements with a foil tab to make connection to a terminal on the housing. These devices were each large enough to drive a speaker cone which was slightly truncated and attached to the center of the structure. In a very small device, such as a personal pager, where a single tone or limited number of tones is utilized, such cumbersome devices cannot, of course, be used and the assembly of an intricate device becomes costly if not impossible. The ideal device would be a highly efficient or low loss unit which could be assembled with a minimum of unskilled hand labor.

SUMMARY OF THE INVENTION

It is therefore an object of the present invention to provide a very small piezoelectric transducer which is highly efficient and easy to assemble.

This object and the others which will become apparent are achieved in a transducer in accordance with the present invention wherein a conductive diaphragm is formed with at least one projecting tab portion. A typical diaphragm diameter would be 0.5 inch or smaller. A piezoelectrically active element is conductively attached to one surface of the diaphragm and the tab forms a first terminal. Around the periphery of the active element an insulating area is formed which extends out into a substantial portion of the projecting tab. A second terminal is then formed by screening a conductive material on the upper or exposed surface of the active element and onto the insulated area, including some of the insulated portion of the diaphragm tab but not electrically contacting the diaphragm. The entire diaphragm assembly is then supported firmly within a housing with a front-to-back air seal provided by an O-ring located near the edge of the diaphragm, preferably not in contact with the active element. Several embodiments of tab and connector arrangement are shown.

BRIEF DESCRIPTION OF THE DRAWINGS

FIG. 1 is a plan view of one embodiment of the invention.

FIG. 2 is a cross-sectional view of the embodiment of FIG. 1, along the section line 2—2.

FIG. 3 is a plan view of another embodiment of the invention.

FIG. 4 is a cut-away view of a portion of the embodiment of FIG. 1 with one interconnect arrangement.

FIG. 5 is a plan view of a portion of the embodiment of FIG. 3 with a possible connector arrangement.

DETAILED DESCRIPTION OF A PREFERRED EMBODIMENT

In the plan view of FIG. 1 and the cut-away view of FIG. 2 may be seen an embodiment of the invention including a diaphragm 10 having a single projecting tab 12. The diaphragm 10 is formed of a thin resilient metal. An electromechanical driver preferably a piezoelectric disc 14 with electrodes 16, 18 formed on opposing face is attached to the diaphragm. The electrodes 16, 18 may be of vapor-deposited nickel. A preform of non-conducting epoxy (not shown) may be used as the cement since, under the heat and pressure of the curing process, the epoxy is absorbed into the surface of the piezoelectric element 14 and the lower electrode 18 is in direct electrical contact with the diaphragm 10. The epoxy mounting is therefore non-insulating. Naturally a conductive cement could be used if so desired. The element 14 is preferably of the type of ceramic which can be "poled" or made piezoelectrically active by application of an appropriate voltage across the material, but the invention is not so limited. After the element 14 is attached to the diaphragm 10, an insulating area 22 is screened onto the diaphragm 10 adjacent the element 14 and covering at least a portion of the tab 12. The insulating material is preferably a screened-on polymer. A second screening process places a conductive layer 24 over at least a portion of the upper electrode 16, over only a portion of the insulating area 22 including the insulated portion of the tab 12. The material of the conductive layer 24 is preferably a silver epoxy. The layer 24 may cover the entire surface of the upper electrode 16 or only a part, the only requirement being that a low resistance connection be made to the electrode 16. At no point does the conductive layer 24 make electrical contact with the diaphragm 10. The insulating area 22 is shown in this embodiment as extending around the entire periphery of the piezoelectric element 14 but this is not necessary. Also indicated in FIG. 2 is the position of a resilient O-ring 26 which may be used to provide a front-to-back seal within the cavity formed by the housing halves 28 and 30. The housing would preferably be formed of a molded plastic with cavity dimensions and port 32 placement and dimensions determined by the desired frequency response and, in apparatus such as pagers, the cavity would comprise a portion of the apparatus housing itself. The tab 12 would extend out of the cavity for easy connector access.

In FIG. 3 is shown another embodiment similar to that of FIG. 1, but having two tabs 12*a* and 12*b*. The insulating area 22 could extend over most or all of the tab 12*a* only, and the conductive layer 24 extends only on the tab 12*a*.

FIG. 4 shows the tab 12 of FIG. 1 with insulating area 22 and conductive layer 24. A portion of a circuit element 34 such as a printed circuit board is shown with two conductors 36, 38 thereon. In order to make connections from the diaphragm tab 12 to the conductor 36 and from the conductive layer 24 to the conductor 38, a small connector 40 is shown. The connector 40 could, if desired, be of the type known as "Zebra" made by Tecknit and consisting of thin, resilient, alternating conductive and non-conductive sheets combined vertically in a block. Another type of suitable connector is one sold commercially as Ampliflex, made by AMP Corporation, and comprising an insulating elastomeric core wrapped with an insulating film having conductive strips or fingers plated thereon. Desirable characteristics of any such connector 40 would include small size and the ability to interconnect the two conductive areas on the diaphragm assembly with the corresponding two areas of the apparatus circuitry without any soldering. Either of the above-mentioned types of connectors needs only to be properly retained in the area between the conductors.

FIG. 5 is a view showing the ends of the tabs 12*a*, 12*b* of FIG. 3. This embodiment could utilize the types of connector blocks 40 as described with respect to FIG. 4, and could also use the spring type of connectors 42 which typically have a dimple or depression 44 at the desired point of contact. Connectors 42 could be riveted, soldered, or otherwise connected to the appropriate circuitry. Similar connectors could be used with the tab 12 of FIG. 1, preferably with one connector 42 connecting directly to the tab 12 on the underside thereof. Solder connections could, of course, be made to the ends of the tabs 12*a*, 12*b* if such is desired.

Thus, there has been shown and described a miniature transducer device which provides low loss operation and simplicity of assembly. A ceramic disc which is either a piezoelectric material or one made so after attachment is affixed to a metal diaphragm which serves as one terminal for the ceramic element. The diaphragm is formed with at least one projecting tab. An insulated area is screened on the diaphragm adjacent the element and out onto the tab. The second terminal is formed by screening a conductive layer on a portion of the ceramic element and out onto the insulated area of the diaphragm tab. When the apparatus is to be assembled, the diaphragm assembly is merely laid in as a unit and a seal such as an O-ring is placed on top, around the ceramic element. Connection to the rest of the apparatus circuitry could be done by soldering, if desired, but more easily by one of the newer "polarized" connectors which needs only to be laid over the two terminals with the interconnecting circuitry placed above in proper alignment. The possibility of misconnections or damage due to unskilled assemblers is therefore almost completely eliminated. It is apparent that the embodiment shown hereinabove are exemplary only and that many modifications and variations of the invention are possible. It is intended to cover all such as fall within the spirit and scope of the appended claims.

What is claimed is:

1. A transducer device as for a miniature radio apparatus and comprising:

a planar metal diaphragm having at least one peripherally projecting portion;

a planar electromechanical element having a surface area less than the surface area of said diaphragm and having electrodes formed on the opposing faces of said element;

non-insulating mounting means for affixing a first face of the electromechanical element centrally of the diaphragm;

a thin insulating layer formed on the diaphragm and adjacent at least a portion of the electromechanical element and extending onto one projecting portion of the diaphragm;

conductive means formed on at least a portion of a second face of the electromechanical element and on a portion of the insulating layer including the insulated area on the projecting portion of the diaphragm but not in electrical contact with the diaphragm, whereby the exposed projecting portion of the diaphragm and the conductive means formed on the projecting portion provide terminals for the device; and housing means for peripherally holding and retaining the diaphragm, having a sound aperture adjacent the second face of the electromechanical element, and having a second aperture for allowing the peripherally projecting portion of the diaphragm, including the extended portion of the insulating layer and the conductive means, to extend beyond the housing means.

2. A transducer device in accordance with claim 1 and wherein the diaphragm includes two peripherally projecting portions and the terminals for the transducer device are the second projecting portion and the conductive means formed on the first projecting portion of the diaphragm respectively.

3. A transducer device in accordance with claim 1 wherein the electromechanical element is of a ceramic material which can be made piezoelectrically active by the appropriate application of a voltage.

4. A transducer device in accordance with claim 1 wherein the non-insulating mounting means is a non-conductive epoxy cured under heat and pressure to allow electrical conduction between the electromechanical element and the diaphragm while maintaining permanent mechanical connection.

* * * * *